United States Patent [19]

Komori et al.

[11] Patent Number: 5,284,807
[45] Date of Patent: Feb. 8, 1994

[54] GLASS FIBER FORMING COMPOSITION, GLASS FIBERS OBTAINED FROM THE COMPOSITION AND SUBSTRATE FOR CIRCUIT BOARD INCLUDING THE GLASS FIBERS AS REINFORCING MATERIAL

[75] Inventors: Kiyotaka Komori, Kadoma; Seishiro Yamakawa, Hirakata; Shigeru Yamamoto, Kyoto; Jun Naka, Kyoto; Tadashi Kukubo, Kyoto, all of Japan

[73] Assignees: Matsushita Electric Works, Ltd., Osaka; Nippon Electric Glass Co., Ltd., Shiga, both of Japan

[21] Appl. No.: 832,267

[22] Filed: Feb. 7, 1992

[30] Foreign Application Priority Data

| Feb. 8, 1991 | [JP] | Japan | 3-017747 |
| Jun. 13, 1991 | [JP] | Japan | 3-142163 |
| Jun. 14, 1991 | [JP] | Japan | 3-143465 |
| Jun. 18, 1991 | [JP] | Japan | 3-145901 |

[51] Int. Cl.$^5$ ............................................. C03L 13/02
[52] U.S. Cl. ........................................ 501/35; 501/38; 501/70; 501/72
[58] Field of Search ..................... 501/35, 38, 69, 70, 501/72

[56] References Cited

U.S. PATENT DOCUMENTS

| 3,060,041 | 10/1962 | Loewenstein . | |
| 4,055,435 | 10/1977 | Sagara | 501/70 X |
| 4,179,300 | 12/1979 | Sagara | 106/47 |
| 4,390,638 | 6/1983 | Mennemann et al. | 501/77 |
| 4,400,473 | 8/1983 | Mennemann et al. | 501/77 |
| 4,830,989 | 5/1989 | Trivedi et al. | 501/35 |

FOREIGN PATENT DOCUMENTS

| 0013379 | 7/1980 | European Pat. Off. . |
| 0227269 | 7/1987 | European Pat. Off. . |
| 1561647 | 2/1969 | France . |
| 2172892A | 10/1986 | United Kingdom . |

OTHER PUBLICATIONS

Patent Abstracts of Japan, vol. 13, No. 461 (C-645) 18 Oct. 1989 & JP-A-01 179 741, Jul. 17, 1989.
World Patents Index Latest, Week 03, Derwent Publications Ltd., AN 90-096954 & JP-A-2 050 834, Feb. 20, 1990.

*Primary Examiner*—Karl Group
*Attorney, Agent, or Firm*—Nikaido Marmelstein Murray & Oram

[57] ABSTRACT

A glass fiber forming composition exhibits a remarkably high dielectric constant $\epsilon_r$ as well as superior chemical resistance, yet it is readily spun into glass fibers. The composition is characterized to show a devitrification temperature which is lower than a spinning temperature at which the glass composition exhibits a viscosity of $10^{2.5}$ poise, so as to be readily spun into corresponding glass fibers. The composition consists essentially of 40 to 65 mol % of $SiO_2$; 20 to 45 mol % of at least one component selected from the group consisting of MgO, CaO, SrO and BaO; 5 to 25 mol % of at least one component selected from the group consisting of $TiO_2$ and $ZrO_2$; and 0.5 to 15 mol % of $NbO_{5/2}$ as calculated from an incorporated amount of $Nb_2O_5$. Alternately, the composition consist essentially of 40 to 65 mol % of $SiO_2$; 20 to 45 mol % of at least one component selected from the group consisting of CaO, SrO and BaO; 5 to 25 mol % of at least one component selected from the group consisting of $TiO_2$ and $ZrO_2$; 0.5 to 15 mol % of $NbO_{5/2}$ as calculated from an incorporated amount of $Nb_2O_5$; and 0.5 to 15 mol % of $AlO_{3/2}$ as calculated from an incorporated amount of $Al_2O_3$. The composition is also characterized to incorporate at least 85 mol % of a total amount of the oxides and have a dielectric constant [$\epsilon_r$] of 9 or more at 1 MHz and 25° C.

7 Claims, 1 Drawing Sheet

GLASS FIBER FORMING COMPOSITION, GLASS FIBERS OBTAINED FROM THE COMPOSITION AND SUBSTRATE FOR CIRCUIT BOARD INCLUDING THE GLASS FIBERS AS REINFORCING MATERIAL

BACKGROUND OF THE INVENTION

1. Field of the Invention

The present invention is directed to a glass fiber forming composition, glass fibers spun therefrom and a substrate for circuit boards including the glass fibers as reinforcing material in a resin layer.

2. Description of the Prior Art

The need for high speed and high frequency information transmission is becoming more and more pronounced with the recent development of sophisticated information systems. In the field of mobile communication by car telephones and personal radios as well as new media of satellite broadcasting and cable television network, there has been an increasing demand of miniaturizing electronic devices and also microwave circuit elements such as dielectric resonators utilized in combination with the electronic devices. The size of the microwave circuit elements is determined in dependance upon the wavelength of an applied electromagnetic wave. It is known that the wavelength $\lambda$ of the electromagnetic wave propagating through a dielectric body having a dielectric constant of $\epsilon_r$ is $\lambda = \lambda_0/(\epsilon_r)^{0.5}$ wherein $\lambda_0$ is propagation wavelength in vacuum. Therefore, the microwave circuit elements can be made more compact when utilizing a circuit board or substrate having a higher dielectric constant. In addition, the use of the circuit board of higher dielectric constant is advantageous in that it acts to concentrate the electromagnetic energy within the board and thereby minimize the leakage of the electromagnetic wave. In order to give a high dielectric constant to the circuit board, there have been utilized in the art;

1) to fabricate the circuit board from a resin of high dielectric constant, for example, polyvinylidene fluoride ($\epsilon_r = 13$) and cyano resin ($\epsilon_r = 16$ to 20);

2) to fabricate the circuit board from a suitable resin and disperse therein inorganic particles of high dielectric constant, for example, $TiO_2$ and $BaTiO_3$ particles; and 3) to fabricate the circuit board from a suitable resin and reinforce the same by glass fibers or a glass fiber cloth of high dielectric constant.

However, the use of the resin of high dielectric constant poses a problem that it suffers from large dielectric loss tangent (tan $\delta$) and unstable dielectric characteristics in high frequency range and is therefore unsatisfactory for use at a high frequency, particularly over 100 MHz.

The circuit board dispersed with the inorganic dielectric particles is likely to have uneven dispersion of the particles leading to correspondingly uneven distribution of dielectric constant on the surface of the board. For this reason, the circuit board of this type is found to be also unsatisfactory. Consequently, the circuit board reinforced by the glass fibers or glass cloth is found desirable. In addition, the glass fiber reinforced circuit board is also found advantageous because of its economy and of easy workability such as cutting and drilling. The conventional glass fiber reinforced circuit board normally utilizes a glass cloth made of E-glass which is composed of $SiO_2$, $Al_2O_3$ and CaO and exhibits less dielectric constant of about 6 to 7. In place of the E-glass, there have been proposed lead glass of rather high dielectric constant. For example, lead glass consisting of 72 wt % of PbO, 26 wt % of $SiO_2$ and 1.5 wt % of $B_2O_3$ and 0.5 wt % of $K_2O$ shows a dielectric constant of 13.0 sufficient to fabricate the circuit board of desired dielectric characteristics. However, such lead glass composition is found difficult to be spun into fibers of 7 to 9 $\mu$m in diameter since PbO will evaporate violently at the time of melting to thereby become less uniform in composition and therefore frequently bring about breakage of thread or fibers in the spinning process. In addition, the lead glass composition is not suitable for forming a glass cloth of fibers for use in the circuit board, since the lead glass composition has inherently low strain point and therefore easily deteriorates in a heating process of removing a primary binder which is essential in forming the glass cloth. Thus, the lead glass composition is permitted to be heat-treated only to a limited extent and is therefore not sufficiently removed of the primary binder, which lowers long-term reliability of the circuit board including the glass cloth formed from the lead glass. Further, due to the toxic nature of the lead, the lead glass composition must be handled carefully and is therefore rather inconvenient and not adequate for fabrication of the glass fiber or glass cloth thereof. Furthermore, due to large dielectric loss tangent (tan $\delta$), the lead glass composition is not adequate for the circuit board for high frequency use.

Besides, it is generally required for reinforcing the circuit board to utilize a glass composition which shows an excellent chemical durabilities so as not to be damaged or deteriorated in various chemical processes of forming a circuit pattern on the circuit board.

SUMMARY OF THE INVENTION

In order to eliminate the above problems, the inventors have noted a glass composition including $SiO_2$, BaO, $TiO_2$ and $ZrO_2$ which is a lead-less composition and shows a good dielectric characteristic as well as excellent chemical durabilities, for example, acid-proof, alkali-proof and water resisting property However, this glass composition has a relatively high devitrification temperature and is therefore found difficult to be spun into corresponding glass fibers. Spinning or fabrication of the glass fibers is generally effected by drawing the melted glass composition through 200 to 800 minute nozzles in the bottom of a platinum pot (generally called as a bushing). In this process, the glass composition of high devitrification temperature undergoes crystallization on the bottom of the bushing due to the devitrification, which hinders smooth drawing of the composition and therefore suffers the breakage of the resulting glass fibers. For successfully fabricating the glass fibers, it has been a general practice to control the temperature of the bushing's bottom as well as to control a winding speed of the resulting glass fibers in an attempt to avoid the devitrification. Nevertheless, even the above control becomes ineffective when the devitrification temperature of the glass composition is higher than a temperature at which the composition has a viscosity of $10^{2.5}$ (316) poise. In other words, the control is not possible at a very low viscosity of the melted glass composition. In view of the above, the glass composition of $SiO_2$—BaO—$TiO_2$—$ZrO_2$ is found not to be suitable for forming the glass fibers because of its higher devitrification temperature than $10^{2.5}$ poise temperature, although it shows a superior dielectric constant [$\epsilon_r$] of as high as 9 or more.

Based upon the above recognitions, much studies have been concentrated on examining an optimum glass composition which not only exhibits a superior dielectric characteristic as well as chemical durabilities but also is capable of being readily formed into glass fibers, and have revealed that a particular glass composition with a high dielectric constant [$\epsilon_r$] as well as low dielectric loss tangent [tan $\delta$] can be improved so as to be readily spun into corresponding glass fibers by the addition of a suitable proportion of $Nb_2O_5$. Through a further investigation into an optimum glass composition incorporating $Nb_2O_5$, the present invention has been accomplished.

Accordingly, it is a primary object of the present invention to provide a glass fiber forming composition which is capable of readily spun into glass fibers, yet retaining desired high dielectric constant [$\epsilon_r$] and low dielectric loss tangent [tan $\delta$], in addition to superior chemical durabilities.

In accordance with the present invention, the glass fiber forming composition consists essentially of:
40 to 65 mol % of $SiO_2$;
20 to 45 mol % of at least one selected from the group consisting of MgO, CaO, SrO and BaO;
5 to 25 mol % of at least one selected from the group consisting of $TiO_2$ and $ZrO_2$; and
0.5 to 15 mol % of $NbO_{5/2}$ as calculated from an incorporated amount of $Nb_2O_5$.

The composition is further characterized to include at least 85 mol % of a total amount of the oxides and have a dielectric constant [$\epsilon_r$] of 9 or more at 1 MHz and 25° C., and to have a devitrification temperature lower than a spinning temperature at which the glass composition exhibits viscosity of $10^{2.5}$ poise so as to be readily spun into corresponding glass fibers. Thus prepared glass composition is found to have excellent characteristics as follows:
1) High dielectric constant [$\epsilon_r$] of 9 or more at 1 MHz and 25° C.;
2) Low dielectric loss tangent [tan $\delta$] of 0.6% or less at 1 MHz and 25° C.;
3) High dielectric constant [$\epsilon_r$] and low dielectric loss tangent [tan $\delta$] can be maintained without causing critical changes in these values even at 100 MHz or more;
4) Superior chemical durabilities such as acid-proof, alkali-proof and water resisting property; and
5) High strain point of about 600° C.

The high strain point is particularly advantageous when preparing a glass cloth for reinforcing a circuit board since it is readily possible to remove a primary binders as required in a process of forming the glass cloth.

$SiO_2$ is essential in the glass composition as a major glass network former and should be incorporated in the above listed proportion (40 to 65 mol %) because of that, with $SiO_2$ proportion of less than 40 mol %, the glass composition suffers a raised devitrification temperature and a lowered viscosity not suitable to form glass fibers, in addition to that the glass composition is given only poor chemical durability, and also because of that, with $SiO_2$ proportion of more than 65 mol %, the glass composition is difficult to have a desired high dielectric constant of 9 or more as well as suffers high glass viscosity not suitable to be formed into glass fibers.

MgO, CaO, SrO and BaO are essential singly or in combination to form a modifier of the glass network for facilitating to melt the glass composition. Particularly, the combination use of the above components is advantageous for lowering the devitrification temperature of the glass composition. Also, CaO, SrO and BaO is useful for increasing the dielectric constant. Below 20 mol % of at least one of the above components the glass composition is difficult to be melted and therefore difficult to be spun into glass fibers, and even difficult to obtain the dielectric constant of at least 9. On the other hand, above 45 mol %, the glass composition suffers from a raised devitrification temperature and a lowered viscosity which makes it difficult to spin the glass composition into glass fibers. Consequently, the total proportion of MgO, CaO, SrO and BaO is limited to be within the range of 20 to 45 mol %.

$TiO_2$ and $ZrO_2$ are essential singly or in combination to increase the dielectric constant as well as to improve the chemical durabilities. It is preferred that the above components are utilized in combination and further that $TiO_2$ is incorporated in a more amount than $ZrO_2$. Below 5 mol % of at least one of $TiO_2$ and $ZrO_2$, the resulting glass composition is difficult to attain a desired dielectric constant of 9 and to improve the chemical durabilities. Above 25 mol %, the resulting glass composition suffers from so raised devitrification temperature as to disable the spinning into glass fibers. Thus, the total proportion of $TiO_2$ and $ZrO_2$ is limited to be within a range of 5 to 25 mol %.

$Nb_2O_5$ is essential in that it lowers remarkably the devitrification temperature. However, it is found that a desired effect is not expected below 0.5 mol % of $NbO_{5/2}$ and that the devitrification temperature will adversely raised when it is added in more than 15 mol %. Thus, the proportion of $NbO_{5/2}$ is limited to be within a range of 0.5 to 15 mol %.

Preferably, the glass composition contains 46 to 60 mol % of $SiO_2$, 25 to 40 mol % of at least one selected from the group consisting of MgO, CaO, SrO and BaO, 7 to 24 mol % of at least one selected from the group consisting of $TiO_2$ and $ZrO_2$, and 1 to 10 mol % of $NbO_{5/2}$ as calculated from an incorporated amount of $Nb_2O_5$. Most preferably, the composition incorporates 28 to 35 mol % of at least one selected from the group consisting of MgO, CaO, SrO and BaO and 2 to 9 mol % of $NbO_{5/2}$.

The total amount of the above-mentioned glass forming oxides should be incorporated in at least 85 mol %. Otherwise, the glass composition fails to show a desired dielectric constant of at least 9 as well as to be properly spun into glass fibers. The glass composition of the present invention may additionally incorporate up to 15 mol % of at least one of suitable oxides such as $TaO_{5/2}$, $AlO_{3/2}$, $LaO_{3/2}$, $CeO_2$, ZnO, $Li_2O$, $Na_2O$, $K_2O$, $MnO_2$, and $BO_{3/2}$.

It is also found that an addition of suitable amount of $Al_2O_3$ together with $Nb_2O_5$ to a like glass composition is particularly advantageous to make the devitrification temperature sufficiently lower than the spinning temperature of $10^{2.5}$ poise viscosity. In fact, the addition of $Al_2O_3$ will substantially restrains the precipitation of cristobalite structure of $SiO_2$ crystals while the addition of $Nb_2O_5$ will do the precipitation of crystals including BaO—TiO—$ZrO_2$, thereby effectively lowering the devitrification temperature in relation to the spinning temperature of $10^{2.5}$ poise viscosity.

It is therefore another object of the present invention to provide a glass fiber forming composition which is capable of sufficiently lowering the devitrification temperature relative to the spinning temperature for readily forming the glass fibers.

The glass composition thus incorporating $Al_2O_3$ together with $Nb_2O_5$ consists essentially of:

- 40 to 65 mol % of $SiO_2$;
- 20 to 45 mol % of at least one selected from the group consisting of CaO, SrO and BaO;
- 5 to 25 mol % of at least one selected from the group consisting of $TiO_2$ and $ZrO_2$;
- 0.5 to 15 mol % of $NbO_{5/2}$ as calculated from an incorporated amount of $Nb_2O_5$; and 0.5 to 15 mol % of $AlO_{3/2}$ as calculated from an incorporated amount of $Al_2O_3$.

The glass composition is also characterized to incorporate at least 85 mol % of a total amount of the oxides and has a dielectric constant $[\epsilon_r]$ of 9 or more at 1 MHz and 25° C., and to show a devitrification temperature which is remarkably lower than a spinning temperature at which said composition exhibits a viscosity of $10^{2.5}$ poise.

$Al_2O_3$ acts in combination with $SiO_2$ as a glass network former and at the same time acts to lower the devitrification temperature and raise the viscosity of the melted composition. No substantial effect is seen when added in less than 0.5 mol % and the devitrification temperature will adversely increase when added in more than 15 mol %. Therefore, the proportion of $Al_2O_3$ should be limited to be within a range of 0.5 to 15 mol %, preferably, 1 to 10 mol %.

Preferably, the glass composition additionally including $Al_2O_3$ is composed of 46 to 60 mol % of $SiO_2$; 25 to 40 mol % of at least one selected from the group consisting of CaO, SrO and BaO; 7 to 24 mol % of at least one selected from the group consisting of $TiO_2$ and $ZrO_2$; 1 to 10 mol % of $NbO_{5/2}$; and 1 to 10 mol % of $AlO_{3/2}$. With this addition of $Al_2O_3$ together with $Nb_2O_5$, the glass composition can be made to have a devitrification temperature which is sufficiently lower than the $10^{2.5}$ poise temperature by as much as 90° C.

The invention also discloses a circuit board comprising a resin layer and a reinforcing member embedded in the resin layer. The reinforcing member is composed of glass fibers which are obtained from the glass composition as disclosed in the above and embedded in the form of filaments, mat or cloth of the glass fibers in order to enhance high mechanical strength and dimensional stability. Preferably, the resin is selected to have low dielectric loss tangent [tan δ] to present desired high frequency performance in combination with the glass fibers or glass cloth thereof embedded in the resin. Included in the resin are PPO (polyphenylene-oxide), fluororesin such as polyethylene fluoride known as Teflon from Dupont, polycarbonate, polyethylene, polyethylene terephtahalate, polypropylene, and polystylene, although the present invention is not limited thereto. The circuit board, of which thickness is normally 0.1 to 2.0 mm, is fabricated from 30 to 95 vol % of resin and 5 to 70 vol % of the reinforcing glass fibers.

The resin is preferably made of a PPO composition composed of PPO (polyphenylene oxide) and at least one of cross-linking polymer and cross-linking monomer, as expressed by a general formula:

wherein each R represents hydrogen or hydrocarbon group having 1 to 3 carbon atoms and may be a different hydrocarbon group from each other. One example of PPO is poly (2.6-dimethyl-1 4-phenylene oxide) which may be synthesized by a manner as disclosed in U.S. Pat. No. 4,059,568. It is preferred but not in a limited sense that PPO is selected to have a weight-average molecular weight [Mw] of 50,000 and a molecular-weight distribution [Mw/Mn] of 4.2 in which Mn is a number-average molecular weight.

Included in the cross-linking polymer are, for example, 1.2-poly butadiene, 1.4-poly butadiene, styrene-butadiene copolymer, denatured 1 2-poly butadiene (maleine-, acryl- and epoxy- denatured) and rubbers, although not limited thereto. The cross-linking polymer may be utilized singly or in combination and may be polymerized in the form of either elastomer or rubber. Also, polystyrene may be added to the cross-linking polymer in such an amount as not to suppress the desired characteristics of the resin.

The cross-linking monomer includes, although not limited thereto:

1) acrylic acid such as ester-acrylate, epoxy-acrylate, urethane-acrylate, ether-acrylate, melamine-acrylate, alkyd-acrylate, and silicon-acrylate;
2) multifunctional monomer such as triallyl cyanurate, triallyl isocyanurate, ethylene glycol dimethacrylate, divinyl benzene, and diallyl phthalate;
3) monofunctional monomer such as vinyl toluene, ethylvinyl benzene, styrene, and paramethylstyrene; and
4) multifunctional epoxy.

The cross-linking monomer may be utilized singly or in combination. Preferably, triallyl cyanurate and/or triallyl isocyanurate is utilized as it is particularly compatible in forming a solution with PPO in addition to that it enhances cross-linking as well as gives improved heat resistance and dielectric characteristic.

An initiator is generally added to the PPO composition. The initiator includes peroxides such as dicumyl peroxide, tert-butylcumyl peroxide, di-tert-butyl peroxide, 2.5-dimethyl-2.5-di-(tert-butyl peroxy)hexyne-3, 2.5-dimethyl-2.5-di-(tert-butyl peroxy)hexane, $\alpha,\alpha'$-bis(-tert-butylperoxy-m-isopropyl)benzene [also referred to as 1.4 (or 1.3)-bis(tert-butylperoxyisopropyl)benzene]; and Biscumyl available from Nippon Yushi KK. The initiator may includes one or more of the above components, although it is not limited thereto.

The resin thus formed of the PPO composition includes at least 7 wt % of PPO, less than 93 wt % of the cross-linking polymer and/or the cross-linking monomer, and 0.1 to 5 wt % of the initiator. Preferably, the PPO composition includes at least 7 wt % of PPO, less than 93 wt % of the cross-linking polymer, less than 70 wt % of the cross-linking monomer, and 0.1 to 5 wt % of the initiator. More preferably, the PPO composition includes at least 10 wt % of PPO, less than 20 wt % of the cross-linking polymer, less than 60 wt % of the cross-linking monomer, and 0.5 to 3 wt % of the initiator. The PPO composition is found particularly advantageous in that it is readily cross-linked by the effect of heat applied at the time of forming the circuit board to be thereby given improved physical properties such as heat-resistance, tensile strength, impact strength, and breaking strength as well as improved dimensional stability.

It is therefore a further object of the present invention to provide a glass-fiber reinforced circuit board which has improved physical properties as well as dimensional stability.

The resin may incorporate a number of inorganic dielectric particles which are dispersed in the resin layer to further increase the dielectric constant of the circuit board. When non-porous dielectric particles are utilized, the particles are preferred to have an average particle size of 1 to 5 μm with a specific surface area of 0.2 to 3.0 m$^2$/g for reason that the particles can be readily and uniformly dispersed in the resin. To further increase the dielectric constant, it is most preferred to utilize porous dielectric particles having minute pores, voids, cracks or the like openings in the outer surface into which the resin can easily permeate. The porous dielectric particles are preferred to have an average particle size of 5 to 100 μm with a specific surface area of 0.3 to 7.0 m$^2$/g. Above 100 μm particle size, the particles are likely to bring about uneven surface configuration of the resin layer or the circuit board, so as to lower moisture proof (water proof) property, to degrade dielectric loss tangent (tan δ), and even to suffer particle breakage in the fabrication process of the circuit board leading to undesired variation in dielectric characteristics. Above 7.0 m$^2$/g specific surface area, the particles will lower moisture proof (water proof) property and degrade dielectric loss tangent (tan δ). Below 0.2 m$^2$/g specific surface area, the particles are not expected to increase dielectric constant of the circuit board. The porous inorganic dielectric particles may be preferably agglomerated particles which are formed from corresponding primary particles to have pores, voids or like opening between the primary particles. The primary particles are preferably combined physically and chemically by sintering.

Preferably, the porous inorganic dielectric particles may include compounds of high dielectric constant having a perovskite or complex perovskite crystalline structure. For example, dielectric particle of such structures includes $BaTiO_3$, $SrTiO_3$, $PbTi_{\frac{1}{2}}Zr_{\frac{1}{2}}O_3$, $Pb(Mg_{\frac{1}{3}}Nb_{\frac{2}{3}})O_3$, $Ba(Sn_xMg_yTa_z)O_3$, and $Ba(Zr_xZn_yTa_z)O_3$. Besides, the porous inorganic dielectric particle may be oxides or complex oxides of $TiO_2$, $ZrO_2$, and $SnO_2$. The porous inorganic dielectric particles may be provided in the form of globular, various block configuration or any other configurations. The circuit board, which is fabricated from a resin to incorporate the dielectric particles together with the glass fibers in accordance with the present invention, is selected to have 25 to 95 vol % of the resin, 5 to 75 vol % of the dielectric particles, and 5 to 70 vol % of the glass fibers. The use of the porous dielectric particles is found particularly effective for increasing dielectric constant [$\epsilon_r$] in that the pores of the particles appear to provide more spaces of high dielectric constant as compared to non-porous particles, in that the porous particles are reluctant to sink in a resin varnish to be thereby readily mixed with the resin for facilitating the fabrication of the circuit board, and also in that the porous particles can be readily fractured at the time of drilling or cutting the resulting circuit board to thereby facilitate the circuit board processing.

It is therefore a still further object of the present invention to provide a glass fiber reinforced circuit board in which the porous dielectric particles are dispersed for increased dielectric constant while assuring satisfactory processing of the circuit board, yet the porous particles can be readily mixed with the resin.

When sintering to obtain the dielectric secondary particles from the primary particles, it is preferred to employ a sintering aid of any kind which will not damage the dielectric characteristic and yield sufficient reinforcing effect. The sintering aid is incorporated in a suitable proportion depending upon a desired effect and also upon the kinds of the aid. Generally, the aid is preferably incorporated in 0.1 to 5 wt % based upon the weight of the dielectric particles and has an average particle size of 0.01 to 100 μm, preferably of 0.1 to 50 μm for a uniformly dispersing purpose. The sintering aid includes $BaO-SiO_2-B_2O_3$, $CaO-SiO_2-B_2O_3$, $Li_2O-SiO_2-B_2O_3$, $Li_2O-Al_2O_3-SiO_2$, $Na_2O-Al_2O_3-SiO_2$, $Li_2O-GeO_2$, $CdO-PbO-SiO_2$, $Li_2O-SiO_2$, $B_2O_3-Bi_2O_3$, $PbO-SiO_2-BaO$, $Na_2O-PbO-SiO_2$, $PbO-GeO_2$, $CuO$, $Bi_2O_3$, $B_2O_3$, $CdO$, $Li_2O$, $PbO$, $WO_3$, $Pb_5Ge_3O_{11}$, $Li_2SiO_3$, $LiF$, $CuF_2$, $ZnF_2$, and $CaF_2$.

With the addition of the sintering aid, it is possible not only to facilitate the sintering but also to strengthen the dielectric particles for avoiding collapsing thereof at the time of fabricating the circuit board, to lower the sintering temperature so as to enable the formation of porous dielectric particles of relatively large pores, hereby increasing the dielectric constant [$\epsilon_r$] of the circuit board.

These and still other objects and advantageous features of the present invention will become more apparent from the following description of the invention when taken in conjunction with the attached drawings.

DESCRIPTION OF THE INVENTION

A glass fiber forming composition in accordance with the present invention is prepared from corresponding oxide (including complex oxide) and/or carbonate, sulfate, chloride, fluoride or the like compound such that it consists essentially of:

40 to 65 mol % of $SiO_2$;
20 to 45 mol % of at least one component selected from the group consisting of MgO, CaO, SrO and BaO;
5 to 25 mol % of at least one component selected from the group consisting of $TiO_2$ and $ZrO_2$; and
0.5 to 15 mol % of $NbO_{5/2}$ as calculated from an incorporated amount of $Nb_2O_5$.

The glass composition also may be prepared from the above materials to consist essentially of:

40 to 65 mol % of $SiO_2$;
20 to 45 mol % of at least one component selected from the group consisting of CaO, SrO and BaO;

5 to 25 mol % of at least one component selected from the group consisting of $TiO_2$ and $ZrO_2$;

0.5 to 15 mol % of $NbO_{5/2}$ as calculated from an incorporated amount of $Nb_2O_5$; and 0.5 to 15 mol % of $AlO_{3/2}$ as calculated from an incorporated amount of $Al_2O_3$.

The resulting glass composition is spun into glass fibers which is embedded into a resin layer of a circuit board as a reinforcing member. For this purpose, the glass fibers may be in the form of a glass cloth that is a woven fabric of the glass fibers, a glass mat that is an unwoven fabric of the glass fibers, or filaments of chopped glass fibers. When formed into glass cloth or mat, the cloth or mat is preferably fabricated from the glass fibers of 0.5 to 20 μm diameter into 15 μm to 1.5 mm thickness. On the other hand, when formed into filaments, it is preferably configured to have a length of 20 to 300 μm and a diameter of 2 to 50 μm.

The circuit board, of which thickness is normally 0.1 to 2.0 mm, is fabricated from 30 to 95 vol % of resin and 5 to 70 vol % of the reinforcing glass fibers. The resin is preferably made of a PPO (polyphenylene oxide) composition including at least 7 wt % of PPO, less than 93 wt % of a cross-linking polymer and/or a cross-linking monomer, and 0.1 to 5 wt % of an initiator. The resin additionally includes a number of inorganic dielectric particles, preferably porous ones to be dispersed therein. The PPO composition including these components in the above-mentioned proportions is prepared as a mixed solution in a solvent with or without a coupling agent which acts to promote adherence of the dielectric particles to the resin component (including the monomer) for giving desired characteristics to the resulting circuit board. To be successfully dissolved in the solvent, the PPO composition is preferably prepared to have a solid resin content of 10 to 30 wt % based on the solvent. After mixing, the solution is removed of the solvent to obtain the PPO composition. Included in the solvent are hydrocarbon halides such as trichloroethylene, trichloroethane, chloroform, and methylene chloride; aromatic hydrocarbons such as chlorobenzen, benzene, toluene, and xylene; acetone and carbon tetrachloride. One or more of the above components may be utilized as the solvent, although not limited thereto. Trichloroethylene is found to be mostly preferred as the solvent.

Figure 1:
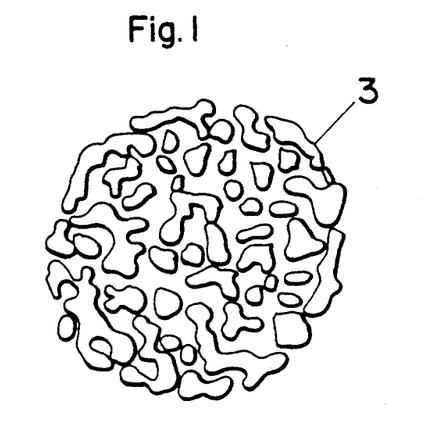
FIG. 1 is a sectional view of an inorganic dielectric particles dispersed in a resin layer of a circuit board fabricated in accordance with the present invention.

The porous inorganic dielectric particles to be dispersed in the resin layer of the circuit board is shown in FIG. 1 to have minute pores, voids, cracks or the like openings in the outer surface into which the resin can easily permeate, and having an average particle size of 5 to 100 μm and a specific surface area of 0.3 to 7.0 $m^2/g$. The dielectric particles may be obtained by pulverizing inorganic dielectric blocks which have been sintered at a relatively low temperature into porous structure. Alternately, the dielectric particles may be obtained by firstly dissipating suitable inorganic particles into, for example, a water solution of PVA (polyvinylalcohol) followed by spraying the solution in a dry atmosphere, for example, at a temperature of 130° C. so as to make resulting granules, and then baking or sintering the resulting granules at a temperature of about 1100° C. into the corresponding particles. In the latter process, the sintering is carried out in such a manner as to effect physical and chemical bondings between particles within the spray-formed granules and to permit grain growth of minute particles but to leave the granules readily separable from each other. The resulting particles are found to be sufficiently porous as they have pores and cracks in the outer surface as well as internal voids.

At the sintering, a suitable additive may be employed to control grain growth and electrical characteristics of the sintered dielectric particles as usual in the general sintering process. In view of that the dielectric particles are preferred to have an average particle size of 5 to 100 μm and a specific surface area of 0.3 to 7.0 $m^2/g$, when forming the dielectric particles as secondary particles agglomerated from primary particles, the primary particles are required to have an average particle size of 0.1 to 5 μm, as determined from a following relation among the particle size d of the primary particle, true specific weight ρ of the primary particle, and specific surface area (Sw) of the secondary particle:

$$d = \frac{6}{\rho \times Sw}$$

That is, an optimum size of the primary particles for barium titanate ($BaTiO_3$) is determined to be 0.14 to 3.3 μm.

The circuit board comprising the resin layer reinforced by the glass fibers and containing the dielectric particles in accordance with the present invention is fabricated from 25 to 95 vol % of the resin, 5 to 75 vol % of the dielectric particles, and 5 to 70 vol % of the glass fibers. Fabrication of the circuit board is generally carried out by firstly preparing the solution of the PPO composition in the solvent, dispersing the inorganic dielectric particles into the solution of the PPO composition, and impregnating the glass cloth in the solution of the PPO composition followed by removing the solvent by drying in air or hot air to prepare a prepreg. A suitable number of prepregs are laminated together with a metal foil or foils and hot-pressed to give a single-sided or double-sided circuit board. By the effect of heat at the hot-pressing, the initiator included in the PPO composition will promote radical polymerization of cross-linking reaction so as to have strong interlayer bonding as well as strong bonding between the layer and the metal foil or foils. Such cross-linking reaction may be alternately effected by ultraviolet or radiation illumination. The radiation cross-linking may be effected subsequent to the heat and/or ultraviolet illumination. It is noted that, prior to being completely cured, the PPO composition sees a slight resin flow which is responsible for good adhesion to the metal foil. A usual adhesive may be additionally utilized to laminate the metal foil.

Figure 2:
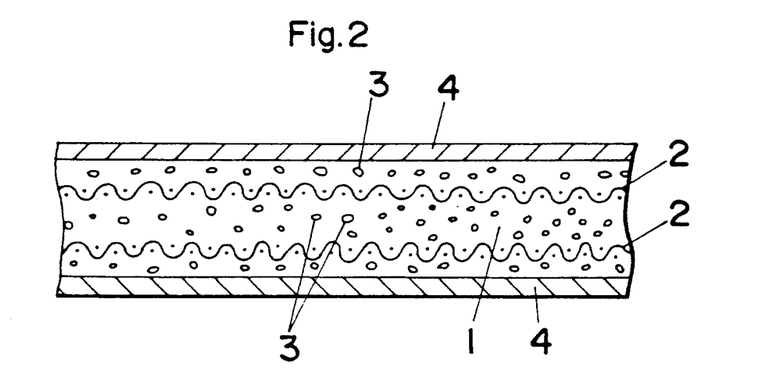
FIG. 2 is a sectional view of the circuit board fabricated to comprises a glass cloth reinforced resin and the dielectric particles dispersed therein.

The metal foil may be of copper or aluminum and is pressed together with the laminate of the prepregs by a suitable pressure which is selected in order to give a desired thickness to the resulting circuit board and at the same time to avoid breaking the dielectric particles. The heating temperature for effecting the cross-linking depends primarily on the reaction temperature of the initiator and is therefore suitably selected in accordance with the kinds of the initiator included in the PPO composition. The heating time may be also selected in accordance with the kinds of the initiator. For example, the heat press is effected at a temperature of 150° to 300° C. and at a pressure of 20 to 40 $kg/cm^2$ for 10 to 60 minutes. FIG. 2 illustrates a typical one of thus fabricated circuit board which comprises the PPO resin layer 1 reinforced by the glass cloth 2, the dielectric particles 3 dispersed in the layer 1, and the metal foils 4 on both sides of the circuit board.

The following examples and comparative examples show the comparative results for a number of different glass compositions and circuit boards fabricated to include the glass fibers, but it is to be understood that these examples are give by way of illustration and not of limitation.

GLASS COMPOSITIONS

Examples 1 to 32 and Comparative Examples 1 to 3

Glass forming materials were placed in a platinum crucible and heated at 1500° C. for 4 hours to provide melted glass compositions with listed proportion of components in Tables 1 to 6. The glass forming materials employed were $SiO_2$, carbonates of MgO, CaO, SrO, and BaO, anatase $TiO_2$, $ZrO_2$, and $Nb_2O_5$. Then, the melted glass compositions were caused to flow over a carbon-made plate and annealed to provide individual glass plates. The resulting glass plates were examined with regard to the following characteristics [A] to [D]. The results are included in Tables 1 to 6.

[A] Dielectric constant and dielectric loss tangent

The glass plates were cut and polished to present corresponding sample specimens which were then formed on both sides thereof with gold electrodes by vacuum evaporation and measured with regard to dielectric constant [$\epsilon_r$] and dielectric loss tangent [tan $\delta$] by an impedance analyzer at 25° C. for respective frequencies of 1 MHz and 1 GHz.

[B] $10^{2.5}$ poise temperature

A portion of each glass plate was melted and was measured by a platinum ball lifting method as to a melt viscosity for determination of a temperature at which the melt viscosity becomes $10^{2.5}$ poise.

[C] Devitrification temperature

A portion of each glass plate was pulverized into particles having a particle size of 297 to 500 μm. The particles were then placed in a platinum tray. The tray was kept within an electric furnace having a temperature gradient for 16 hours and was then allowed to cool in the air for determination of the devitrification temperature by microscope observation as to the appearance of the devitrification.

[D] Glass fiber forming feasibility

The remainder of each glass was pulverized and placed into a platinum tray and melted by electrically heating the tray. While maintaining the tray at $10^{2.5}$ poise temperature, the melt was drawn or spun through a minute nozzle in the bottom of the tray and wound in order to obtain a glass fiber.

Although the glass plate was re-melted in order to draw the glass fiber therefrom in the above Examples, the glass fiber may be directly drawn from the initial melt of the glass composition when it is required to obtain the glass fibers in a mass production scale. No substantial difference in the listed characteristics will be expected between the resulting glass fibers spun directly from the initial melt of the glass composition and from the melt of the glass plate.

TABLE 1

| | Example 1 | Example 2 | Example 3 | Example 4 | Example 5 | Example 6 | Example 7 | Example 8 |
|---|---|---|---|---|---|---|---|---|
| Composition (mol %) | | | | | | | | |
| $SiO_2$ | 50.0 | 50.0 | 50.0 | 50.0 | 50.0 | 50.0 | 50.0 | 50.0 |
| CaO | 7.5 | 7.5 | 7.5 | 7.5 | 7.5 | 7.5 | 7.5 | 9.0 |
| SrO | 7.5 | 7.5 | 7.5 | 7.5 | 7.5 | 7.5 | 7.5 | 6.0 |
| BaO | 15.0 | 15.0 | 15.0 | 15.0 | 15.0 | 15.0 | 15.0 | 15.0 |
| MgO | — | — | — | — | — | — | — | — |
| $TiO_2$ | 9.08 | 10.73 | 11.55 | 10.7 | 12.38 | 13.2 | 14.85 | 11.55 |
| $ZrO_2$ | 1.92 | 2.27 | 2.45 | 3.3 | 2.62 | 2.8 | 3.15 | 2.45 |
| $NbO_{5/2}$ | 9.0 | 7.0 | 6.0 | 6.0 | 5.0 | 4.0 | 2.0 | 6.0 |
| dielectric constant $\epsilon_r$ (1 MHz) | 11.7 | 11.6 | 11.6 | 11.2 | 11.5 | 11.5 | 11.5 | 11.5 |
| dielectric constant $\epsilon_r$ (1 GHz) | 11.7 | 11.6 | 11.6 | 11.2 | 11.5 | 11.5 | 11.5 | 11.5 |
| dielectric loss tan $\delta$ [%] (1 MHz) | 0.08 | 0.08 | 0.09 | 0.09 | 0.08 | 0.08 | 0.09 | 0.08 |
| dielectric loss tan $\delta$ [%] (1 GHz) | 0.31 | 0.30 | 0.29 | 0.28 | 0.30 | 0.30 | 0.29 | 0.30 |
| $10^{2.5}$ poise temp. Tx (°C.) | 1147 | 1150 | 1153 | 1152 | 1155 | 1151 | 1158 | 1149 |
| devitrification temp. Ty (°C.) | 1080 | 1071 | 1070 | 1090 | 1080 | 1095 | 1120 | 1066 |
| (Tx-Ty) °C. | 67 | 79 | 83 | 62 | 75 | 56 | 38 | 83 |
| glass fiber forming feasibility | good | good | good | godd | good | good | good | good |

TABLE 2

| | Example 9 | Example 10 | Example 11 | Example 12 | Example 13 | Example 14 | Example 15 |
|---|---|---|---|---|---|---|---|
| Composition (mol %) | | | | | | | |
| $SiO_2$ | 52.5 | 52.5 | 55.0 | 55.0 | 55.0 | 49.0 | 49.02 |
| CaO | 9.3 | 7.75 | 7.5 | 7.5 | 7.5 | 7.3 | 7.35 |
| SrO | 6.2 | 7.75 | 7.5 | 7.5 | 7.5 | 7.3 | 7.35 |
| BaO | 15.5 | 15.5 | 15.0 | 15.0 | 15.0 | 14.6 | 14.71 |
| MgO | — | — | — | — | — | — | — |
| $TiO_2$ | 9.53 | 9.53 | 8.7 | 9.28 | 9.9 | 14.5 | 14.56 |
| $ZrO_2$ | 2.02 | 2.02 | 1.8 | 1.97 | 2.1 | 3.4 | 3.09 |
| $NbO_{5/2}$ | 4.95 | 4.95 | 4.5 | 3.75 | 3.0 | 3.9 | 3.92 |
| dielectric constant $\epsilon_r$ (1 MHz) | 11.0 | 10.9 | 10.5 | 10.5 | 10.4 | 11.8 | 11.9 |
| dielectric constant $\epsilon_r$ (1 GHz) | 10.9 | 10.9 | 10.5 | 10.4 | 10.4 | 11.8 | 11.8 |
| dielectric loss tan $\delta$ [%] (1 MHz) | 0.07 | 0.07 | 0.08 | 0.07 | 0.07 | 0.09 | 0.08 |
| dielectric loss tan $\delta$ [%] (1 GHz) | 0.29 | 0.29 | 0.27 | 0.28 | 0.28 | 0.29 | 0.30 |

TABLE 2-continued

|  | Example 9 | Example 10 | Example 11 | Example 12 | Example 13 | Example 14 | Example 15 |
|---|---|---|---|---|---|---|---|
| $10^{2.5}$ poise temp. Tx (°C.) | 1164 | 1168 | 1180 | 1173 | 1175 | 1157 | 1145 |
| devitrification temp. Ty (°C.) | 1096 | 1124 | 1126 | 1130 | 1117 | 1112 | 1102 |
| (Tx-Ty) °C. | 68 | 44 | 54 | 43 | 58 | 45 | 43 |
| glass fiber forming feasibility | good | good | good | good | good | good | good |

TABLE 3

|  | Example 16 | Example 17 | Example 18 | Example 19 |
|---|---|---|---|---|
| Composition (mol %) | | | | |
| $SiO_2$ | 47.16 | 50.0 | 50.0 | 50.0 |
| CaO | 7.03 | 6.5 | 7.5 | 6.9 |
| SrO | 7.03 | 6.5 | 7.5 | 6.9 |
| BaO | 14.05 | 13.0 | 15.0 | 13.7 |
| MgO | — | 4.0 | — | — |
| $TiO_2$ | 13.95 | 14.85 | 11.5 | 11.5 |
| $ZrO_2$ | 3.27 | 3.15 | 2.5 | 2.5 |
| $NbO_{5/2}$ | 7.51 | 2.0 | 4.5 | 6.0 |
| $TaO_{5/2}$ | — | — | 1.5 | — |
| $LaO_{3/2}$ | — | — | — | 2.5 |
| dielectric constant $\epsilon_r$ (1 MHz) | 12.3 | 11.2 | 11.2 | 11.4 |
| dielectric constant $\epsilon_r$ (1 GHz) | 12.3 | 11.2 | 11.2 | 11.4 |
| dielectric loss tan δ [%] (1 MHz) | 0.08 | 0.10 | 0.07 | 0.09 |
| Dielectric loss tan δ [%] (1 GHz) | 0.31 | 0.30 | 0.30 | 0.31 |
| $10^{2.5}$ poise temp. Tx (°C.) | 1085 | 1149 | 1153 | 1145 |
| devitrification temp. Ty (°C.) | 1085 | 1095 | 1090 | 1115 |
| (Tx-Ty) °C. | 51 | 54 | 63 | 30 |
| glass fiber forming feasibility | good | good | good | good |

TABLE 4

|  | Example 20 | Example 21 | Example 22 | Example 23 | Example 24 |
|---|---|---|---|---|---|
| Composition (mol %) | | | | | |
| $SiO_2$ | 50.0 | 50.0 | 50.0 | 50.0 | 40.0 |
| CaO | 6.9 | 6.9 | 6.8 | 7.5 | 9.0 |
| SrO | 6.9 | 6.9 | 6.8 | 7.5 | 6.0 |
| BaO | 13.7 | 13.7 | 13.4 | 15.0 | 15.0 |
| MgO | — | — | — | — | — |
| $TiO_2$ | 11.5 | 11.5 | 11.5 | 7.45 | 17.33 |
| $ZrO_2$ | 2.5 | 2.5 | 2.5 | 1.6 | 3.67 |
| $NbO_{5/2}$ | 6.0 | 6.0 | 6.0 | 11.0 | 9.0 |
| $CeO_2$ | 2.5 | — | — | — | — |
| ZnO | — | 2.5 | — | — | — |
| $Li_2O$ | — | — | 1.0 | — | — |
| $Na_2O$ | — | — | 1.0 | — | — |
| $K_2O$ | — | — | 1.0 | — | — |
| Dielectric constant $\epsilon_r$ (1 MHz) | 11.5 | 11.1 | 11.1 | 11.7 | 14.1 |
| Dielectric constant $\epsilon_r$ (1 GHz) | 11.5 | 11.1 | 11.1 | 11.6 | 14.1 |
| dielectric loss tan δ [%] (1 MHz) | 0.08 | 0.09 | 0.05 | 0.08 | 0.11 |
| dielectric loss tan δ [%] (1 GHz) | 0.30 | 0.30 | 0.22 | 0.30 | 0.31 |
| $10^{2.5}$ poise temp. Tx (°C.) | 1145 | 1136 | 1080 | 1142 | 1090 |
| devitrification temp. Ty (°C.) | 1118 | 1130 | 1078 | 1140 | 1089 |
| (Tx-Ty) °C. | 27 | 6 | 2 | 2 | 1 |
| glass fiber forming feasibility | good | good | good | good | good |

TABLE 5

|  | Example 25 | Example 26 | Example 27 | Example 28 | Example 29 | Example 30 | Example 31 | Example 32 |
|---|---|---|---|---|---|---|---|---|
| Composition (mol %) | | | | | | | | |
| $SiO_2$ | 55.0 | 50.0 | 50.0 | 50.0 | 50.0 | 50.0 | 48.0 | 50.0 |
| CaO | 9.0 | 9.0 | 9.0 | 7.5 | 9.0 | 6.8 | 9.0 | 6.9 |
| SrO | 6.0 | 6.0 | 6.0 | 7.5 | 6.0 | 6.8 | 6.0 | 6.9 |
| BaO | 15.0 | 15.0 | 15.0 | 15.0 | 15.0 | 13.4 | 15.0 | 13.7 |
| $TiO_2$ | 7.8 | 9.9 | 9.5 | 9.5 | 9.1 | 11.5 | 9.1 | 11.5 |
| $ZrO_2$ | 1.7 | 2.1 | 2.0 | 2.0 | 1.9 | 2.5 | 1.9 | 2.5 |
| $NbO_{5/2}$ | 3.0 | 6.0 | 6.0 | 6.0 | 6.0 | 6.0 | 6.0 | 6.0 |
| $AlO_{3/2}$ | 2.5 | 2.0 | 2.5 | 2.5 | 3.0 | 3.0 | 5.0 | 2.5 |
| dielectric constant $\epsilon_r$ (1 MHz) | 10.1 | 11.2 | 11.1 | 11.1 | 11.0 | 11.0 | 11.0 | 11.0 |
| dielectric constant $\epsilon_r$ (1 GHz) | 10.1 | 11.2 | 11.1 | 11.1 | 11.0 | 11.0 | 11.0 | 11.0 |
| dielectric loss tan δ [%] (1 MHz) | 0.07 | 0.08 | 0.08 | 0.08 | 0.08 | 0.08 | 0.08 | 0.09 |
| dielectric loss tan δ [%] (1 GHz) | 0.27 | 0.29 | 0.29 | 0.29 | 0.28 | 0.28 | 0.28 | 0.28 |
| $10^{2.5}$ poise temp. Tx (°C.) | 1199 | 1154 | 1162 | 1160 | 1166 | 1164 | 1160 | 1158 |
| devitrification temp. Ty (°C.) | 1085 | 1054 | 1063 | 1065 | 1060 | 1064 | 1057 | 1070 |
| (Tx-Ty) °C. | 114 | 100 | 99 | 95 | 106 | 100 | 103 | 88 |
| glass fiber forming feasibility | excellent | excellent | excellent | excellent | excellent | excellent | excellent | excellent |

TABLE 6

|  | Comparative Example 1 | Comparative Example 2 | Comparative Example 3 |
|---|---|---|---|
| Composition (mol %) | | | |
| $SiO_2$ | 40.0 | 50.0 | 50.0 |
| CaO | 7.5 | 7.5 | 9.0 |
| SrO | 7.5 | 7.5 | 6.0 |
| BaO | 15.0 | 15.0 | 15.0 |
| MgO | — | — | 11.5 |
| $TiO_2$ | 23.0 | 16.5 | 2.5 |
| $ZrO_2$ | 7.0 | 3.5 | — |
| $NbO_{5/2}$ | — | — | — |
| $AlO_{3/2}$ | — | — | 6.0 |
| dielectric constant $\epsilon_r$ (1 MHz) | 13.5 | 11.0 | 10.6 |
| dielectric constant $\epsilon_r$ (1 GHz) | 13.5 | 11.0 | 10.6 |
| dielectric loss tan δ [%] (1 MHz) | 0.13 | 0.09 | 0.09 |
| dielectric loss tan δ [%] (1 GHz) | 0.32 | 0.29 | 0.30 |
| $10^{2.5}$ poise temp. Tx (°C.) | 1077 | 1147 | 1176 |
| devitrification temp. Ty (°C.) | 1214 | 1204 | 1203 |

TABLE 6-continued

|  | Comparative Example 1 | Comparative Example 2 | Comparative Example 3 |
|---|---|---|---|
| (Tx-Ty) °C. | −137 | −57 | −27 |
| glass fiber forming feasibility | not acceptable | not acceptable | not acceptable |

As concluded from the listed results of Tables 1 to 6, the glass composition of Examples 1 to 32 exhibit desired dielectric characteristics for use in a circuit board and can be readily spun into the glass fibers. In contrast, the glass fiber are not available from Comparative Example 1 lacking $Nb_2O_5$ and incorporating excess amounts of $TiO_2$ and $ZrO_2$, Comparative Example 2 lacking $Nb_2O_5$, and Comparative Example 3 incorporating $Al_2O_3$ but not $Nb_2O_5$. For all of Comparative Examples 1 to 3, the devitrification temperature Ty is higher than the $10^{2.5}$ poise temperature Tx in contrast to Examples 1 to 32. Thus, the relation [Tx - Ty] between the devitrification temperature and $10^{2.5}$ poise temperature is found to well indicative of the glass fiber forming feasibility. Also, it is confirmed that $Al_2O_3$ alone will not impart the glass fiber forming feasibility.

CIRCUIT BOARDS

Example 33

A double-sided circuit board was fabricated from PPO (poly-phenylene-oxide) resin which was reinforced by a glass cloth obtained from the glass fiber of Example 3 and additionally incorporated a number of porous dielectric particles.

The glass cloth utilized was a plain weave having a thickness of 100 μm with a fiber diameter of 7 μm and having a weave density of 60 warps and 58 wefts per 25×25 mm.

The porous dielectric particles were chiefly composed of $BaTi_{0.7}Zr_{0.3}O_3$, which were prepared through the steps of wet-blending 500 g of $BaTi_{0.7}Zr_{0.3}O_3$ having an average particle size of 0.1 μm, 2.5 g of borosilicate glass (available from Iwaki Glass Co., Ltd., Japan), and 50 ml of 5 wt % solution of polyvinyl alcohol in 1 l of ion exchanged water, spray-granulating it into corresponding granules of primary particles, and then sintering the granules at 1050° C. for 2 hours. The resulting porous dielectric particles were agglomerated or secondary particles from the primary particles and have an average particle size of 20 μm and a specific surface area of 1.0 m²/g.

Mixture of 180 parts by weight [30 vol %] of porous $BaTi_{0.7}Zr_{0.3}O_3$ particles and 74 parts by weight [70 vol %] of PPO were added to 300 parts by weight of trichloroethylene (sold under the trade name of "Trichlene" from Toa Gosei Chemical Industry Co., Ltd., Japan) and then stirred by means of a 2 l capacity reactor with bubble distinguishing capability to obtain a bubble-free resin varnish in which PPO was completely dissolved.

The glass cloth was impregnated in thus prepared resin varnish and dried at 50° C. to form a prepreg containing 62 wt % [about 70 vol %] of the mixture of PPO and $BaTi_{0.7}Zr_{0.3}O_3$ particles and 38 wt % [about 30 vol %] of the glass cloth. Five sheets of the resulting prepregs were laminated together with 17 μm thick copper foils and heat-pressed at a pressure of 33 Kg/cm² at 250° C. for 10 minutes to form a double-side circuit board.

Comparative Example 4

A double-sided circuit board was fabricated in the identical manner as in Example 33 except that a glass cloth utilized was obtained from a lead glass which consists essentially of 41.2 mol % of PbO, 55.3 mol % of $SiO_2$, 2.8 mol % of $B_2O_3$, and 0.7 mol % of $K_2O$ and which has a dielectric constant of 13.0 at 1 MHz, 12.9 at 1 GHz and a dielectric loss tangent [tan δ] of 0.09 % at 1 MHz and 0.54 % at 1 GHz.

Comparative Example 5

A double-sided circuit board was fabricated in the identical manner as in Example 33 except that a glass cloth utilized was obtained from an E-glass which consists essentially of 57.9 mol % of $SiO_2$, 8.7 mol % of $Al_2O_3$, 7.3 mol % of $B_2O_3$, 24.2 mol % of CaO, 1.6 mol % of MgO, and 0.3 mol % of $K_2O$ and which has a dielectric constant of 6.5 at 1 MHz and also at 1 GHz and a dielectric loss [tan δ] of 0.15% at 1 MHz and 0.28% at 1 GHz.

Examples 34 to 39

Double-sided circuit boards were fabricated in the identical manner as in Example 33 except that there were utilized the PPO compositions of different component proportions as listed in Table 7.

TABLE 7

| (by weight parts) | 34 & 47 | 35 & 48 | 36 & 49 | 37 & 50 | 38 & 51 | 39 & 52 |
|---|---|---|---|---|---|---|
| PPO (poly-phenylene-oxide) | 110 | 40 | 110 | 40 | 110 | 110 |
| cross-linking polymer | SBS#1) 80 parts | SBS 120 parts | SBS 80 parts | SBS 120 parts | p-TAIC#3) 90 parts | — |
| cross-linking monomer | TAIC#2) 10 parts | TAIC 40 parts | TAIC 10 parts | TAIC 40 parts | — | TAIC 90 parts |
| initiator#4) | 4 | 4 | 4 | 4 | 4 | 4 |
| porous dielectric particles | 470 | 470 | 470 | 470 | 470 | 470 |
| solvent (trichloroethylene) | 1000 | 1000 | 1000 | 1000 | 1000 | 1000 |

1)SBS is for styrene butadiene copolymer
2)TAIC for triallylisocyanate
3)p-TAIC for polymer of TAIC,
4)2-5-dimethyl-2-5-di-(tert-butylperoxy)hexyne-3 [sold under the tradename of Perhexyne 25B from Nippon Yushi KK]

Example 40

A double-sided circuit board was fabricated in the identical manner as in Example 33 except that dielectric particles utilized were non-porous $BaTi_{0.7}Zr_{0.3}O_3$ having an average particle size of 20 μm and a specific surface area of 0.2 m²/g.

Example 41

A double-sided circuit board was fabricated in the identical manner as in Example 33 except that dielectric particles utilized were non-porous $BaTi_{0.7}Zr_{0.3}O_3$ having an average particle size of 1.6 μm and a specific surface area of 1.5 m²/g.

Example 42

A double-sided circuit board was fabricated in the identical manner as in Example 33 except that dielectric particles utilized were 347 g of non-porous $TiO_2$ [rutile] having an average particle size of 3.4 μm and a specific surface area of 1.7 m²/g.

Example 43

A double-sided circuit board was fabricated in the identical manner as in Example 33 except for dielectric particles. The dielectric particles utilized here were prepared by wet-blending 500 g of $Ba_{0.7}Sr_{0.3}TiO_3$ having an average particle size of 0.1 μm, 1.7 g of CuO, and 50 ml of wt % solution of polyvinyl alcohol in 1 l of ion exchanged water, spray-granulating it into corresponding granules of primary particles, and then sintering the granules at 1000° C. for 2 hours. The resulting porous dielectric particles were agglomerated or secondary particles from the primary particles and have an average particle size of 21 μm and a specific surface area of 1.3 m²/g.

Example 44

A double-sided circuit board was fabricated in the identical manner as in Example 33 except for dielectric particles. The dielectric particles utilized here were prepared by wet-blending 500 g of $BaTi_{0.7}Zr_{0.3}O_3$ having an average particle size of 0.1 μm, and 50 ml of 5 wt % solution of polyvinyl alcohol in 1 l of ion exchanged water, spray-granulating it into corresponding granules of primary particles, and then sintering the granules at 1100° C. for 2 hours. The resulting porous dielectric particles were agglomerated or secondary particles from the primary particles and have an average particle size of 80 μm and a specific surface area of 5.6 m²/g.

Example 45

A double-sided circuit board was fabricated in the identical manner as in Example 33 except for dielectric particles. The dielectric particles utilized here were prepared by wet-blending 100 g of $BaTi_{0.7}Zr_{0.3}O_3$ having an average particle size of 0.1 μm, 1.7 g of CuO, and 10 ml of 5 wt % solution of polyvinyl alcohol in 1 l of ion exchanged water, spray-granulating it into corresponding granules of primary particles, and then sintering the granules at 1100° C. for 2 hours. The resulting porous dielectric particles were agglomerated or secondary particles from the primary particles and have an average particle size of 6 μm and a specific surface area of 5.3 m²/g.

Example 46

A double-sided circuit board was fabricated in the identical manner as in Example 33 except that a glass cloth was obtained from the glass composition of Example 26.

Example 47

A double-sided circuit board was fabricated in the identical manner as in Example 34 except that a glass cloth was obtained from the glass composition of Example 26.

Example 48

A double-sided circuit board was fabricated in the identical manner as in Example 35 except that a glass cloth was obtained from the glass composition of Example 26.

Example 49

A double-sided circuit board was fabricated in the identical manner as in Example 36 except that a glass cloth was obtained from the glass composition of Example 26.

Example 50

A double-sided circuit board was fabricated in the identical manner as in Example 37 except that a glass cloth was obtained from the glass composition of Example 26.

Example 51

A double-sided circuit board was fabricated in the identical manner as in Example 38 except that a glass cloth was obtained from the glass composition of Example 26.

Example 52

A double-sided circuit board was fabricated in the identical manner as in Example 39 except that a glass cloth was obtained from the glass composition of Example 26.

Example 53

A double-sided circuit board was fabricated in the identical manner as in Example 40 except that a glass cloth was obtained from the glass composition of Example 26.

Example 54

A double-sided circuit board was fabricated in the identical manner as in Example 41 except that a glass cloth was obtained from the glass composition of Example 26.

Example 55

A double-sided circuit board was fabricated in the identical manner as in Example 42 except that a glass cloth was obtained from the glass composition of Example 26.

Example 56

A double-sided circuit board was fabricated in the identical manner as in Example 43 except that a glass cloth was obtained from the glass composition of Example 26.

Example 57

A double-sided circuit board was fabricated in the identical manner as in Example 44 except that a glass cloth was obtained from the glass composition of Example 26.

Example 58

A double-sided circuit board was fabricated in the identical manner as in Example 45 except that a glass cloth was obtained from the glass composition of Example 26.

In Examples 34 to 58 and Comparative Examples 4 and 5, the incorporation ratio of the dielectric particles to the PPO resin or PPO composition was 30:70 by volume and the incorporation ratio of the mixture of the dielectric particles plus the PPO resin or PPO composition to the glass cloth was 70:30 by volume, as in the same proportions for Example 33.

The circuit boards of Examples 33 to 58 and Comparative Examples 4 and 5 were examined with regard to dielectric constant [$\epsilon_r$], dielectric loss tangent [tan δ], peel strength, solder resistance at 260° C. The results are listed in Table 8. To determine the solder resistance, the circuit boards of the Examples and the comparative Examples were cut into 30×30 mm specimens. Three specimens of the same kind were floated on a melted solder maintaining at 260° C. for 25, 45, and 60 seconds, respectively and then withdrawn therefrom to observe whether the specimens suffers any warp, blister, or like deformation. The solder resistance was then evaluated in terms of the time [seconds] during which the deformation appeared in the specimens. That is, solder resistance of 25 sec., as listed in Table 8, means that the specimen suffers the deformation after being floated on the solder of 260° C. for 25 seconds or less and solder resistance of 60 or more means that the specimen sees no substantial deformation even after being exposed to the solder of 260° C. for 60 seconds.

son of Examples 46 to 52 and 56 to 58 with Examples 53 to 55, the incorporation of the porous dielectric particles is confirmed to certainly increase dielectric constant of the circuit board.

Another test was made by the use of PCT tester (manufactured by Shimadzu Seisakusho, Ltd.) with regard to grain strength of the porous dielectric particles utilized in Examples 33 to 39, 43, 45 to 52, 56, and 58 which were obtained by sintering in the presence of the sintering aid of borosilicate glass and those utilized in Examples 44 and 57 which were obtained by sintering in the absence of the sintering aids. The results are that the porous dielectric particles of the former Examples [33 to 39, 43, 45 to 52, and 58] has a grain strength of 7.0 to 8.5 kg/mm$^2$, while those of the latter Examples [44 and 57] has a grain strength of 3.5 to 3.8 kg/mm$^2$. Accordingly, it is also confirmed that the use of the sintering aid in forming the porous dielectric particles is particularly advantageous for increasing the grain strength.

What is claimed is:

1. A glass fiber obtained from a glass composition which consists essentially of 0 to 15 mol % of at least one oxide selected from the group consisting of TaO$_{2.5}$, LaO$_{1.5}$, CeO$_2$, ZnO, Li$_2$O, Na$_2$O, K$_2$O, MnO$_2$, and BO$_{1.5}$ and 85-100 mol % of an oxide mixture, said oxide

TABLE 8

|  | dielectric constant $\epsilon_r$ | | dielectric loss tan δ (%) | | peel strength [kg/cm] | solder resistance at 260° C. [seconds] |
| --- | --- | --- | --- | --- | --- | --- |
|  | 1 MHZ | 1 GHz | 1 MHz | 1 GHz | | |
| Example 33 | 20.5 | 20.4 | 0.32 | 0.60 | 2.3 | 25 |
| Comparative Example 4 | 21.4 | 21.2 | 0.33 | 0.80 | 2.3 | 25 |
| Comparative Example 5 | 16.5 | 16.5 | 0.33 | 0.60 | 2.3 | 25 |
| Example 34 | 20.0 | 20.0 | 0.32 | 0.60 | 2.1 | 60 or more |
| Example 35 | 19.6 | 19.5 | 0.31 | 0.59 | 2.0 | 60 or more |
| Example 36 | 20.2 | 20.1 | 0.30 | 0.58 | 2.0 | 60 or more |
| Example 37 | 20.2 | 20.1 | 0.30 | 0.57 | 2.3 | 60 or more |
| Example 38 | 20.5 | 20.4 | 0.31 | 0.58 | 2.4 | 60 or more |
| Example 39 | 20.4 | 20.3 | 0.34 | 0.62 | 2.3 | 60 or more |
| Example 40 | 13.0 | 13.0 | 0.28 | 0.55 | 2.3 | 25 |
| Example 41 | 12.7 | 12.7 | 0.28 | 0.53 | 2.3 | 25 |
| Example 42 | 10.2 | 10.2 | 0.28 | 0.42 | 2.3 | 25 |
| Example 43 | 20.3 | 20.3 | 0.32 | 0.59 | 2.3 | 25 |
| Example 44 | 25.0 | 25.0 | 0.35 | 0.62 | 2.3 | 25 |
| Example 45 | 24.3 | 24.3 | 0.35 | 0.62 | 2.2 | 25 |
| Example 46 | 20.2 | 20.1 | 0.32 | 0.60 | 2.3 | 25 |
| Example 47 | 19.8 | 19.7 | 0.31 | 0.59 | 2.1 | 60 or more |
| Example 48 | 19.4 | 19.3 | 0.31 | 0.58 | 2.0 | 60 or more |
| Example 49 | 20.2 | 19.9 | 0.30 | 0.58 | 2.0 | 60 or more |
| Example 50 | 20.2 | 19.9 | 0.30 | 0.57 | 2.3 | 60 or more |
| Example 51 | 20.3 | 20.2 | 0.30 | 0.57 | 2.4 | 60 or more |
| Example 52 | 20.2 | 20.1 | 0.33 | 0.62 | 2.3 | 60 or more |
| Example 53 | 12.8 | 12.8 | 0.27 | 0.54 | 2.3 | 25 |
| Example 54 | 12.5 | 12.5 | 0.27 | 0.52 | 2.3 | 25 |
| Example 55 | 10.1 | 10.1 | 0.27 | 0.41 | 2.3 | 25 |
| Example 56 | 20.0 | 20.0 | 0.32 | 0.59 | 2.3 | 25 |
| Example 57 | 24.8 | 24.8 | 0.35 | 0.62 | 2.3 | 25 |
| Example 58 | 24.1 | 24.1 | 0.35 | 0.62 | 2.2 | 25 |

As apparent from Table 8, the circuit board of Example 33 shows a lower dielectric loss [tan δ] at 1 GHz than that of Comparative Example 4 using the glass cloth made of lead glass and shows a higher dielectric constant than that of Comparative Example 5 using the glass cloth of E-glass. Therefore, the circuit board of Example 33 is found to be particularly suitable for a high frequency use.

It is also found that the circuit boards of Examples 34 to 39 and 47 to 52 utilizing the PPO composition including cross-linking polymer or monomer in addition to PPO are give improved heat resistance as compared to the circuit boards of the other Examples.

Further, from comparison of Examples 33 to 39 and 43 to 45 with Examples 40 to 42, and also from comparimixture consisting essentially of:
- 40 to 65 mol % of SiO$_2$;
- CaO, SrO and BaO in amounts which total 20 to 45 mol % of the oxide mixture;
- TiO$_2$ and ZrO$_2$ in amounts which total 5 to 25 mol % of the oxide mixture; and
- 0.5 to 15 mol % of NbO$_{5/2}$ said composition having a dielectric constant $\epsilon_r$ of 9 or more at 1 MHz and 25° C.; and said composition being characterized to show a devitrification temperature which is lower than a spinning temperature at which said composition exhibits a viscosity of $10^{2.5}$ poise.

2. A glass fiber obtained from a glass composition which consists essentially of 0 to 15 mol % of at least one oxide selected from the group consisting of $TaO_{2.5}$, $LaO_{1.5}$, $CeO_2$, $ZnO$, $Li_2O$, $Na_2O$, $K_2O$, $MnO_2$, and $BO_{1.5}$ and 85-100 mol % of an oxide mixture, said oxide mixture consisting essentially of:

40 to 65 mol % of $SiO_2$;

CaO, SrO and BaO in amounts which total 20 to 45 mol % of the oxide mixture;

$TiO_2$ and $ZrO_2$ in amounts which total 5 to 25 mol % of the oxide mixture;

0.5 to 15 mol % of $NbO_{5/2}$; and

0.5 to 15 mol % of $AlO_{3/2}$;

said composition having a dielectric constant $\epsilon_r$ of 9 or more at 1 MHz and 25° C.; and said composition being characterized to show a devitrification temperature which is lower than a spinning temperature at which said composition exhibits a viscosity of $10^{2.5}$ poise.

3. A glass fiber obtained from a glass composition which consists essentially of 0 to 15 mol % of at least one oxide selected from the group consisting of $TaO_{2.5}$, $LaO_{1.5}$, $CeO_2$, $ZnO$, $Li_2O$, $Na_2O$, $K_2O$, $MnO_2$, and $BO_{1.5}$ and 85-100 mol % of an oxide mixture, said oxide mixture consisting essentially of     40 to 65 mol % of $SiO_2$;

MgO, CaO, SrO and BaO in amounts which total 20 to 45 mol % of the oxide mixture;

$TiO_2$ and $ZrO_2$ in amounts which total 5 to 25 mol % of the oxide mixture;

0.5 to 15 mol % of $NbO_{2.5}$;

said composition having a dielectric constant $\epsilon_r$ of 9 or more at 1 MHz and 25° C.; and said composition being characterized to show a devitrification temperature which is lower than a spinning temperature at which said composition exhibits a viscosity of $10^{2.5}$ poise.

4. A glass fiber as set forth in claim 1, wherein said oxide mixture, consists essentially of:

46 to 60 mol % of $SiO_2$;

CaO, SrO and BaO, in amounts which total 25 to 40 mol % of the oxide mixture, with 13.0 to 15.5 mol % of BaO;

$TiO_2$ and $ZrO_2$ in amounts which total 7 to 24 mol % of the oxide mixture; and     1 to 10 mol % of $NbO_{5/2}$.

5. A glass fiber as set forth in claim 3, wherein said oxide mixture consists essentially of:

46 to 60 mol % of $SiO_2$;

MgO, CaO, SrO and BaO, in amounts which total 28 to 35 mol % of the oxide mixture with 0 to 4 mol % of MgO, 6.5 to 9.3 mol % of CaO, 6.0 to 7.75 mol % of SrO, 13.0 to 15.5 mol % of BaO;

$TiO_2$ and $ZrO_2$ in amounts which total 9.05 to 21 mol % of the oxide mixture, with 7.45 to 17.33 mol % of $TiO_2$ and 1.6 to 3.67 mol % of $ZrO_2$; and     2 to 9 mol % of $NbO_{5/2}$.

6. A glass fiber as set forth in claim 2, wherein said oxide mixture consists essentially of:

46 to 60 mol % of $SiO_2$;

CaO, SrO and BaO, in amounts which total 26.2 to 31.5 mol % of the oxide mixture, with 6.8 to 9.0 mol % of CaO, 6.0 to 7.5 mol % of SrO, and 13.4 to 15.0 mol % of BaO;

$TiO_2$ and $ZrO_2$, in amounts which total 9.5 to 14 mol % of the oxide mixture, with 7.8 to 11.5 mol % of $TiO_2$ and 1.7 to 2.5 mol % of $ZrO_2$;

1 to 10 mol % of $NbO_{5/2}$; and

1 to 10 mol % of $AlO_{3/2}$.

7. A glass fiber as set forth in claim 3, wherein said oxide mixture consists essentially of:

46 to 60 mol % of $SiO_2$;

MgO, CaO, SrO and BaO in amounts which total 25 to 40 mol % of the oxide mixture with 13.0 to 15.5 mol % of BaO;

$TiO_2$ and $ZrO_2$ in amounts which total 7 to 24 mol % of the oxide mixture; and     1 to 10 mol % of $NbO_{2.5}$.

* * * * *